US009269772B2

(12) United States Patent
Xiao (10) Patent No.: US 9,269,772 B2
(45) Date of Patent: Feb. 23, 2016

(54) SEMICONDUCTOR DEVICE AND FABRICATION METHOD THEREOF

(71) Applicant: SEMICONDUCTOR MANUFACTURING INTERNATIONAL (SHANGHAI) CORPORATION, Shanghai (CN)

(72) Inventor: De Yuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/281,007

(22) Filed: May 19, 2014

(65) Prior Publication Data

US 2015/0034906 A1 Feb. 5, 2015

(30) Foreign Application Priority Data

Jul. 31, 2013 (CN) .......................... 2013 1 0327038

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |
| *H01L 29/15* | (2006.01) |
| *H01L 29/66* | (2006.01) |
| *H01L 29/78* | (2006.01) |
| *H01L 29/10* | (2006.01) |
| *H01L 29/12* | (2006.01) |
| *H01L 29/778* | (2006.01) |

(52) U.S. Cl.
CPC .......... *H01L 29/151* (2013.01); *H01L 29/1037* (2013.01); *H01L 29/122* (2013.01); *H01L 29/66431* (2013.01); *H01L 29/66462* (2013.01); *H01L 29/66969* (2013.01); *H01L 29/7783* (2013.01); *H01L 29/7789* (2013.01); *H01L 29/78* (2013.01); *H01L 29/0657* (2013.01)

(58) Field of Classification Search
CPC ............ H01L 29/66462; H01L 29/778; H01L 29/66431; H01L 29/78; H01L 29/151; H01L 29/1037; H01L 29/66969
USPC ............... 257/14, 24, 190; 438/197, 283, 285
See application file for complete search history.

(56) References Cited

U.S. PATENT DOCUMENTS

| | | | |
|---|---|---|---|
| 2008/0237577 A1* | 10/2008 | Chui | ................... H01L 29/1054 257/24 |
| 2012/0074386 A1 | 3/2012 | Rachmady et al. | |
| 2014/0203243 A1* | 7/2014 | Xiao | ................. H01L 29/66795 257/24 |

* cited by examiner

Primary Examiner — Thien F Tran
(74) Attorney, Agent, or Firm — Innovation Counsel LLP (57) ABSTRACT

A semiconductor device and a method for fabricating the same are disclosed. In the method, a substrate structure is provided, including a substrate and a fin-shaped buffer layer formed on the surface of the substrate. A QW material layer is formed on the surface of the fin-shaped buffer layer. A barrier material layer is formed on the QW material layer. The QW material layer is suitable for forming an electron gas therein. Thereby the short-channel effect is improved, while high mobility of the semiconductor device is guaranteed. In addition, according to the present disclosure, thermal dissipation of the semiconductor device may be improved, and thus performance and stability of the device may be improved.

11 Claims, 9 Drawing Sheets

SEMICONDUCTOR DEVICE AND FABRICATION METHOD THEREOF

CROSS-REFERENCE TO RELATED APPLICATIONS

This application claims priority to Chinese Patent Application No. 201310327038.5, filed on Jul. 31, 2013 and entitled "SEMICONDUCTOR DEVICE AND FABRICATION METHOD THEREOF", which is incorporated herein by reference in its entirety.

FIELD OF THE INVENTION

The present disclosure relates to a semiconductor device and fabrication method thereof.

DESCRIPTION OF THE RELATED ART

The High Electron Mobility Transistor (HEMT) may typically comprise modulated doped heterojunctions and corresponding source-drain structures. Because a Two Dimensional Electron Gas (2-DEG) in the heterojunction is substantially not affected by the scattering of ionized impurity ions, it may have a very high mobility, and thus HEMT devices have attracted widespread attention recently.

With the scaling-down of device dimension, it has been proposed to employ Ultra-Thin Body (UTB), such as Quantum Well (QW) structure, in HEMT device to alleviate or prevent a short-channel effect of transistor. Generally, in silicon device, amorphous dielectrics, such as, silicon oxide, are used to form a UTB layer of silicon on an insulator. However, such materials have thermally insulating characteristic so that the heat dissipation performance of the device may be poor. Moreover, the existing non-planar QW transistors are apt to suffer electron overflow, thereby deteriorating device performance.

SUMMARY

The inventor of the inventive concept noticed the above problems in the prior art, and accordingly provide a novel solution to at least alleviate or address at least some of the problems.

According to an aspect of an embodiment of this disclosure, a method of fabricating a semiconductor device is provided which comprises: providing a substrate structure including a substrate and a fin-shaped buffer layer formed over a surface of the substrate; forming a Quantum Well (QW) material layer on a surface of the fin-shaped buffer layer, the QW material layer being suitable for forming an electron gas therein; and forming a barrier material layer on the QW material layer.

In an embodiment, the substrate further includes an insulating portion adjacent to the fin-shaped buffer layer, the insulating portion being formed along both sides of the buffer layer on the surface of the substrate which is not covered by the buffer layer. The forming a QW material layer on the surface of the fin-shaped buffer layer may comprise: forming a QW material layer on the surface of the fin-shaped buffer layer that is not covered by the insulating portion.

In an embodiment, the method may further comprise: forming a cap layer on the barrier material layer; and forming a gate structure including a gate insulating layer on at least a portion of the cap layer, a gate on the gate insulating layer, and a spacer for the gate.

In an embodiment, the method may further comprise: forming a cap layer on the barrier material layer; and forming a gate structure including a gate insulating layer on a portion of the cap layer and a portion of the insulating portion, a gate on the gate insulating layer, and a spacer for the gate.

In an embodiment, the method may further comprise: further comprising: etching the fin shaped buffer layer with the gate structure as a mask, until at least a portion of the fin-shaped buffer layer is removed; and growing a semiconductor material on the etched portion of the fin-shaped buffer layer to form a source region and a drain region.

In an embodiment, the providing a substrate structure may comprise: forming a buffer layer over the substrate; patterning the buffer layer to form the fin-shaped buffer layer.

In an embodiment, the fin-shaped buffer layer may have a thickness in range of about 1-2 μm; the QW material layer may have a thickness in range of about 10-50 nm; and/or the barrier material layer may have a thickness in range of about 1-5 nm.

In an embodiment, the forming of the QW material layer and/or the forming of the barrier material layer comprise(s) selective epitaxy growth.

In an embodiment, the material of the fin-shaped buffer layer can be AlN; the material of the QW material layer can be GaN; and the material of the barrier material layer can be AlN. In an embodiment, the QW material can be one of the following materials: InGaN, AlGaN, Ge, Group III-Group V semiconductor materials, or Group II-Group VI semiconductor materials. In an embodiment, the substrate can be a Si substrate.

According to another aspect of an embodiment of this disclosure, a semiconductor device is provided which comprises: a substrate; a fin-shaped buffer layer over the substrate; a Quantum Well (QW) material layer on the fin-shaped buffer layer, the QW material layer being suitable for forming an electron gas therein; and a barrier material layer on the QW material layer.

In an embodiment, the semiconductor device may further comprise: an insulating portion on the surface of the substrate adjacent to the fin-shaped buffer layer, the insulating portion being formed along both sides of the buffer layer on the surface of the substrate which is not covered by the buffer layer; and wherein the QW material layer is formed on the surface of the fin-shaped buffer layer that is not covered by the insulating portion.

In an embodiment, the semiconductor device may further comprise: a cap layer on the barrier material layer; and a gate structure, wherein the gate structure comprises a gate insulating layer on at least a portion of the cap layer, a gate on the gate insulating layer, and a spacer for the gate.

In an embodiment, the semiconductor device may further comprising: a cap layer on the barrier material layer; and a gate structure, wherein the gate structure comprises a gate insulating layer on a portion of the cap layer and a portion of the insulating portion, a gate on the gate insulating layer, and a spacer for the gate.

In an embodiment, the device may further comprise a source region and a drain region each formed on an etched portion of the fin-shaped buffer layer.

Further features of the inventive concept and advantages thereof will become apparent from the following detailed description of exemplary embodiments according to the inventive concept with reference to the attached drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

The inventive concept can be clearly and fully understood from the following description with reference to the drawings, in which.

DESCRIPTION OF THE EMBODIMENTS

Various exemplary embodiments of the present disclosure will now be described in detail with reference to the drawings. It is noted that the relative arrangement of the components and steps, the numerical expressions, and numerical values set forth in these embodiments are not intended to limit the scope of the inventive concept, unless it is specifically stated otherwise.

Further, it would be appreciated that the dimensions of the elements in the drawings may not be drawn to scale for the convenience of illustration.

The following description of exemplary embodiments is merely illustrative and is not intended to limit the inventive concepts, or its applications or uses.

Techniques, methods and devices as known to one of ordinary skill in the relevant arts may be omitted from being discussed in detail, but are regarded as parts of the specification where appropriate.

In all of the examples illustrated and discussed herein, any specific values should be interpreted to be illustrative only and non-limiting. Thus, other examples of the exemplary embodiments may have different values.

Notice that similar reference numerals and letters are used to refer to similar elements throughout the figures, and thus once an element is defined in a figure, it is possible that it would not be further discussed in the descriptions for the following figures.

Figure 1:
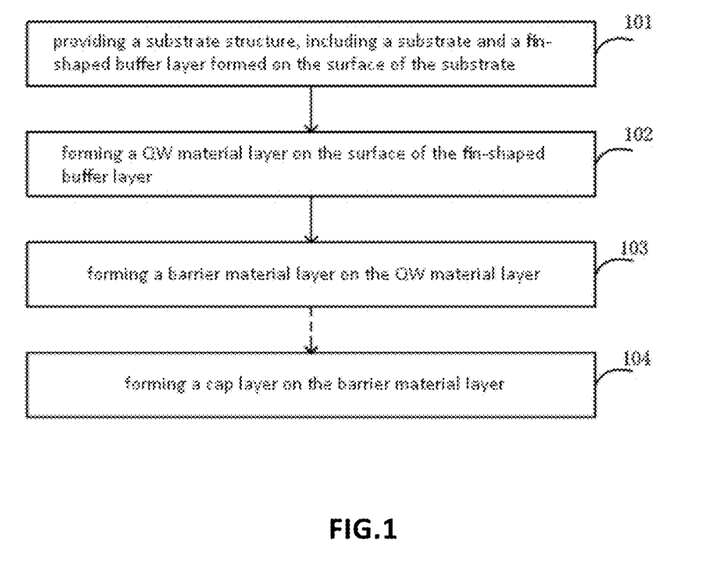
FIG. 1 is a schematic flowchart of a method for fabricating semiconductor device according to an embodiment of this disclosure.

FIG. 1 is a schematic flowchart of a method for fabricating a semiconductor device according to an embodiment of the present disclosure. As shown in FIG. 1, at step 101, a substrate structure is provided, including a substrate and a fin-shaped buffer layer formed over a surface of the substrate. In an embodiment, the step of providing a substrate structure described above may comprise: forming a buffer layer over the substrate; and patterning the buffer layer to form the fin-shaped buffer layer. In some embodiments, the substrate described above can be, for example, a silicon (Si) substrate, however, it should be understood that the inventive concept is not limited thereto.

In some embodiments, the material of the fin-shaped buffer layer may be aluminum nitride (AlN). The thermal conductivity of AlN is about 3.4 W/cm-K, while the thermal conductivity of silicon oxide is about 0.014 W/cm-K, less than that of AlN by two orders of magnitude. Thus, AlN facilitates fast dissipation of heat generated by semiconductor device such as HEMT using AlN as a material for the fin-shaped buffer layer, so that performance and stability of semiconductor devices can be improved. In the case that AlN is employed as the material for the fin-shaped buffer layer, the substrate may be a (111) Si substrate, that is, a Si substrate the primary surface of which is at the (111) crystal plane. In some other embodiments, the substrate may be, for example, a sapphire substrate or other appropriate substrate.

Next, at step 102, a Quantum Well (QW) material layer is formed on a surface of the fin-shaped buffer layer. Herein, the QW material may be gallium nitride (GaN), for example, n-type doped GaN. The QW material layer may be formed with selective epitaxy growth, for example. The QW material layer can be suitable for forming an electron gas therein.

Then, at step 103, a barrier material layer is formed on the QW material layer. The material of the barrier material layer may be aluminum nitride (AlN). The barrier material layer may also be formed by means of selective epitaxy growth.

A QW structure may be constructed with the barrier material layer, the QW material layer and the buffer layer, wherein a potential barrier can be formed by the barrier material layer and the buffer layer, and a potential well can be formed by the QW material layer.

With the semiconductor device fabrication method shown in FIG. 1, a semiconductor device having a non-planar (e.g., fin-shaped) QW structure can be formed. With the QW structure according to the present disclosure, short-channel effect may be relieved for the semiconductor device (for example, HEMT device) while high carrier mobility can be guaranteed. In addition, the semiconductor device according to the present disclosure can significantly improve heat dissipation of the device, and thus the performance and thermal stability of the device can be improved.

Then, a gate structure may be further formed. In some preferred embodiments, an optional cap layer (for example, GaN) may be formed on the barrier material layer, as shown in step 104 of FIG. 1, for facilitating subsequent process steps (for example, forming a high-k dielectric) and protecting the QW structure from being adversely influenced in subsequent steps. The cap layer may be formed by means of, for example, selective epitaxy growth. After that, a gate structure (herein, referred to as a first gate structure) can be formed, wherein the first gate structure comprises a gate insulating layer (for example, High-k oxide) on at least a portion of the cap layer, a gate on the gate insulating layer, and spacer(s) on a wall of the gate. The gate structure can be formed using methods, process steps and materials that are known in the art, which will not be described in detail herein.

In addition, in other embodiments, an insulating portion (for example, SiO) can be further formed on the surface of the substrate adjacent to the fin shaped buffer layer. In such an embodiment, the step of forming a QW material layer on the surface of the fin-shaped buffer layer may comprise: forming the QW material layer on a surface of the fin-shaped buffer layer that is not covered by the insulating portion. In this embodiment, the QW material layer is formed on a surface of the fin-shaped buffer layer that is not covered by the insulating portion. Thus, this embodiment is different from the above embodiment of forming the first gate structure in that, a gate structure that is formed after forming the cap layer on the barrier material layer (herein, referred to as a second gate structure) may comprise a gate insulating layer on a portion of the cap layer and a portion of the insulating portion, a gate on the gate insulating layer, and spacer(s) on the wall of the gate.

It should, however, be understood that the present disclosure is not limited only to the embodiments described and illustrated herein. As an example, the QW material can be one of the following materials: indium gallium nitride (InGaN), aluminum gallium nitride (AlGaN), germanium (Ge), and III-V or II-VI family semiconductor materials. Also, those skilled in the art can readily select appropriate buffer layer materials and barrier layer materials with the above QW materials, to form the semiconductor structure according to the present disclosure.

In some embodiments, the fin-shaped buffer layer can have a thickness in range of about 1-20 μm, preferably about 1-2 μm, for example, about 1.5 μm. The QW material layer can have a thickness in a range of about 10-50 nm, for example, 20 nm, 30 nm, 40 nm, etc. The barrier material layer can have a thickness in a range of about 1-5 nm, e.g., about 4 nm. The cap layer can have a thickness in a range of about 1-3 nm, e.g., about 2 nm. It should be understood that those numbers or numerical ranges are merely exemplary, and not limitations to the inventive concept.

In some embodiments, after forming the above gate structure, an etching may be performed using the gate structure as a mask, until at least a portion of the fin-shaped buffer layer is removed by the etching. Then, a semiconductor material (for example, N+ doped GaN) can be grown on the etched portion of the fin-shaped buffer layer to form a source region and a drain region.

FIG. 2-FIG. 11 schematically show stages of a process for fabricating semiconductor device according to an embodiment of the present disclosure.

Figure 2:
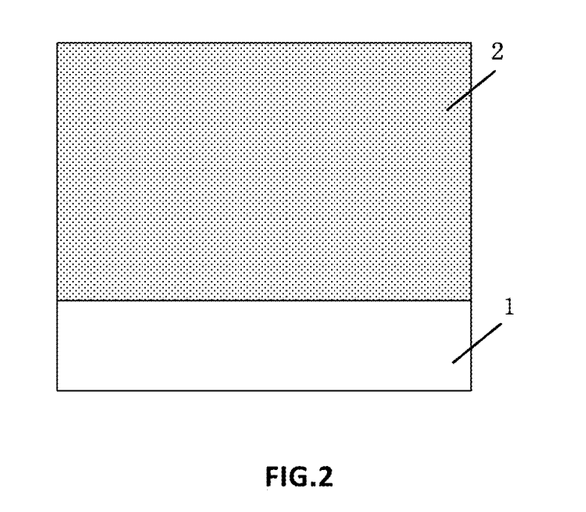
FIGS. 2-11 schematically illustrate views of a semiconductor device during various fabrication processes according to an embodiment of the present disclosure.

First, as shown in FIG. 2, a buffer layer 2 is formed on the substrate 1 by means of, for example, Metal-organic Chemical Vapor Deposition (MOCVD), Atomic Layer Deposition (ALD), Molecular Beam Epitaxy (MBE), or other process. In this embodiment, the material of the buffer layer 2 can be AlN, and the material of the substrate 1 can be silicon (Si). The crystal orientation of a primary surface of the Si substrate 1 can be <111> orientation.

Figure 3A:
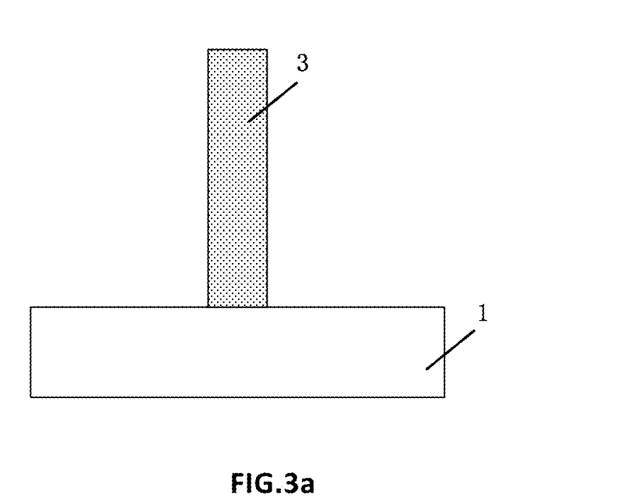
Figure 3B:
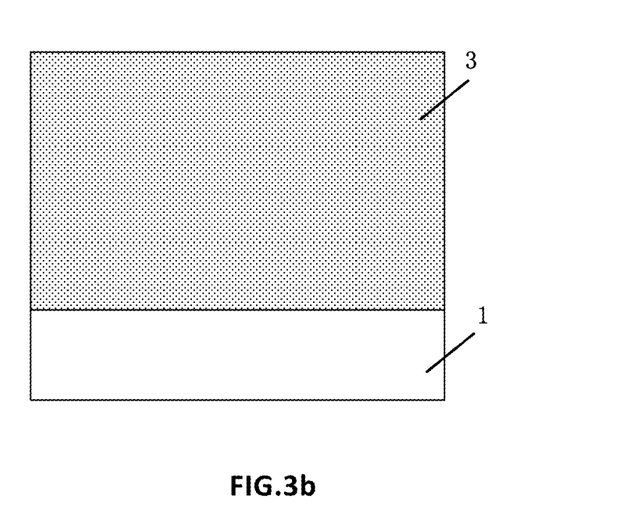

Then, as shown in FIG. 3a and FIG. 3b, the buffer layer 2 is patterned by, for example, lithography and dry etching to form a fin-shaped buffer layer 3 on the substrate 1. As shown in FIG. 3a, the fin-shaped buffer layer may have a pillar shape formed on the substrate and extend along a channel length direction. Wherein, FIG. 3a shows a cross-sectional view taken in a direction perpendicular to the longitudinal direction of the fin (the direction of the channel which is to be later formed), FIG. 3b shows a cross-sectional view taken along the longitudinal direction of the fin (the channel direction).

Figure 4A:
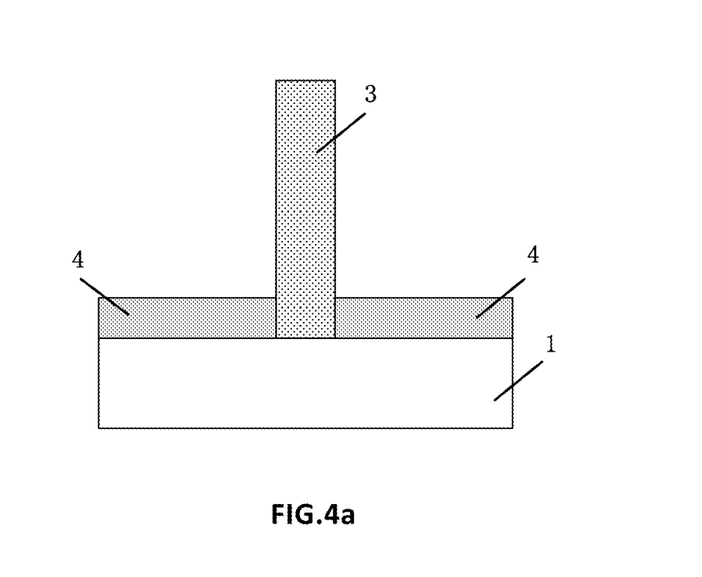
Figure 4B:
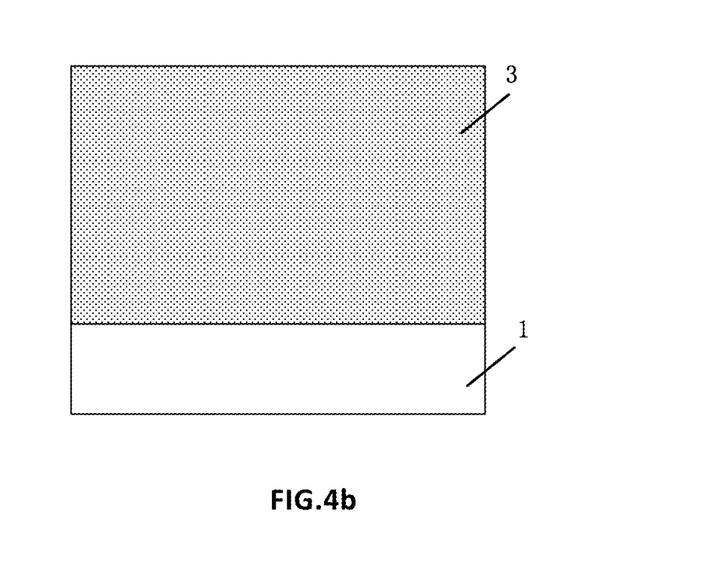

Next, as shown in FIG. 4a and FIG. 4b, an insulating portion 4 is formed on the surface of the substrate 1 adjacent to the fin shaped buffer layer 3. In a particular example, the insulating portion 4 may be formed of a silicon oxide layer, with a thickness of about 50-500 nm and formed along both sides of the buffer layer on a surface of the substrate 1 which is not covered by the buffer layer 3. Similarly, FIG. 4a is a cross-sectional view taken perpendicularly to the channel direction, and FIG. 4b is a cross-sectional view taken along the channel direction. As mentioned above, in some embodiments, the insulating layer can be omitted.

Figure 5A:
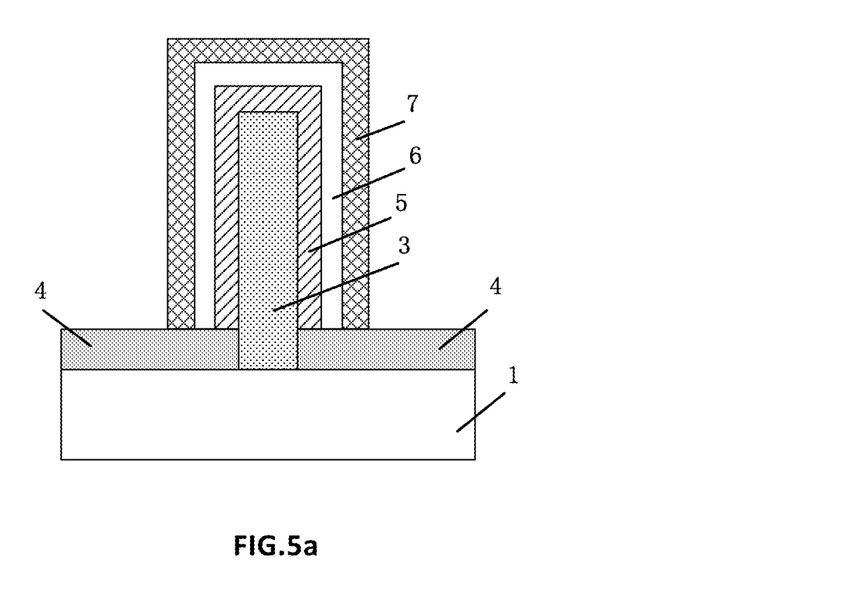
Figure 5B:
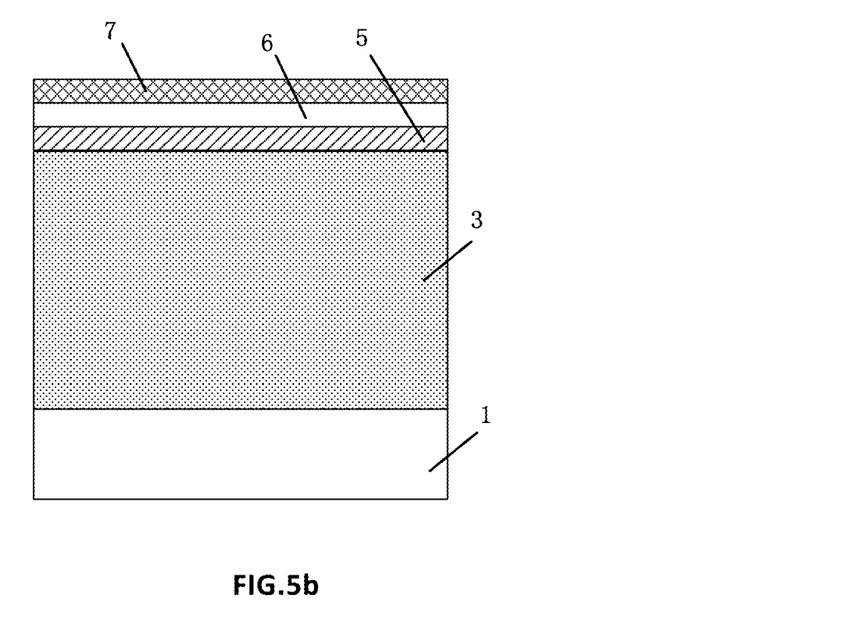

Then, as shown in FIG. 5a and FIG. 5b, a QW material layer 5 is formed on the surface of the fin-shaped buffer layer 3, a barrier material layer 6 is formed on the QW material layer 5, and a cap layer 7 is formed on the barrier material layer 6. Similarly, FIG. 5a is a cross-sectional view taken perpendicularly to the channel direction, and FIG. 5b is a cross-sectional view taken along the channel direction. In this embodiment, the QW material is GaN, the barrier material is AlN, and the cap layer is GaN. As mentioned above, the QW material layer 5, the barrier material layer 6, and/or the cap layer 7 can be formed by means of selective epitaxy growth.

In addition, in this embodiment, the fin-shaped buffer layer 3 has a thickness in a range of about 1-2 μm, the QW material layer 5 has a thickness in a range of about 10-50 nm, the barrier material layer 6 has a thickness in a range of about 1-5 nm, and the cap layer 7 has a thickness in a range of about 1-3 nm.

Figure 6A:
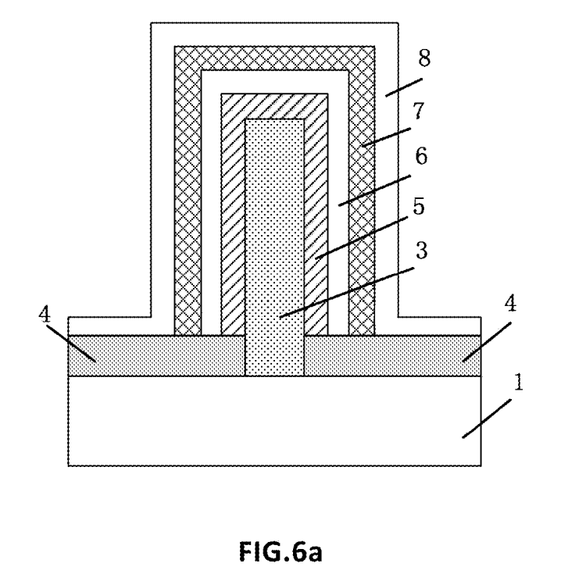
Figure 6B:
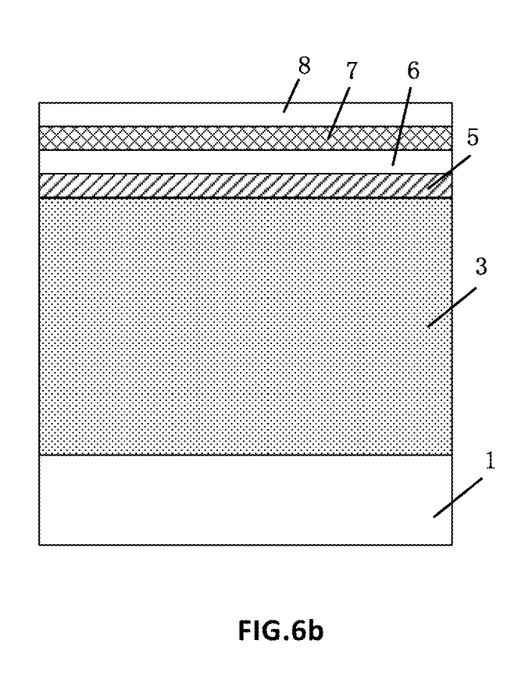

Next, as shown in FIG. 6a and FIG. 6b, a gate insulating layer 8 is formed. The gate insulating layer 8 can cover at least a portion of the insulating portion 4 and at least a portion of the cap layer 7. Similarly, FIG. 6a is a cross-sectional view taken perpendicularly to the channel direction, and FIG. 6b is a cross-sectional view taken along the channel direction. In a particular example, the material of the gate insulating layer 8 can be a high-K dielectric, and the gate insulating layer 8 can has a thickness in range of about 1-5 nm.

Figure 7A:
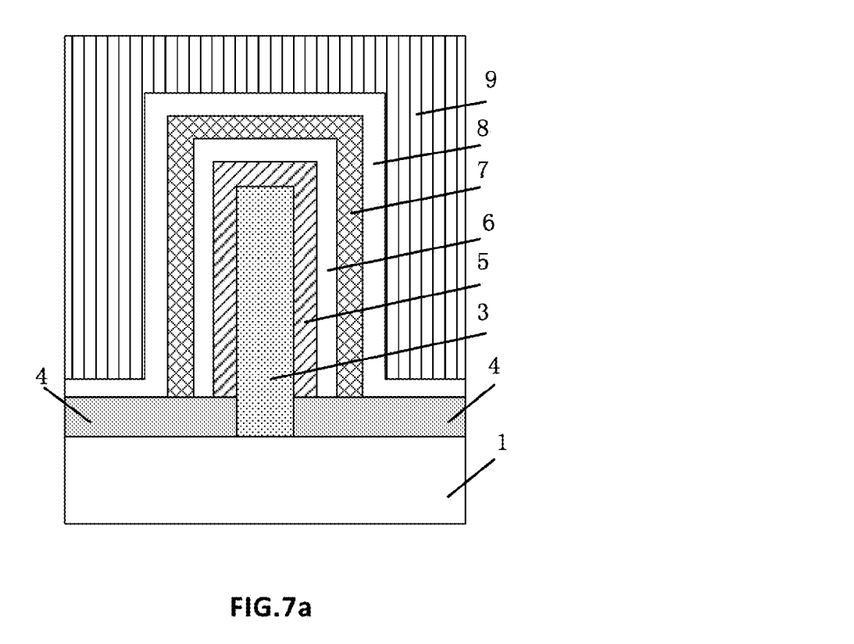
Figure 7B:
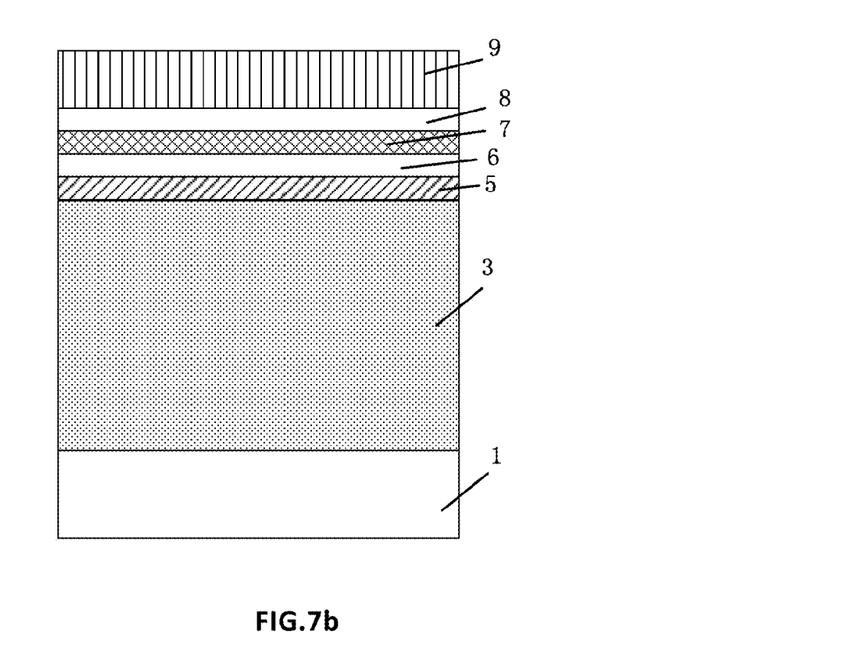

Next, as shown in FIG. 7a and FIG. 7b, with PVD, MOCVD, ALD, MBE, etc., for example, gate material 9 is deposited on the gate insulating layer 8. FIG. 7a is a cross-sectional view taken perpendicularly to the channel direction, and FIG. 7b is a cross-sectional view taken along the channel direction. Herein, the gate material can be a metal material, such as Ni—Au or Cr—Au.

Figure 8:
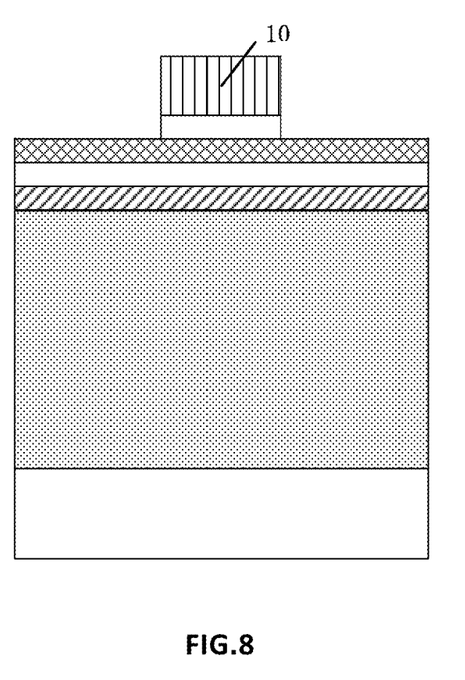

Next, as shown in FIG. 8, the gate material 9 is patterned to form a gate 10. FIG. 8 is a cross-sectional view taken along the channel direction. It should be understood that the inventive concept is not limited thereto. For example, in another specific example, the gate material can be polysilicon, and the gate 10 can be a polysilicon gate or a pseudo gate. The polysilicon pseudo gate can be replaced by a metal gate in additional steps.

Figure 9:
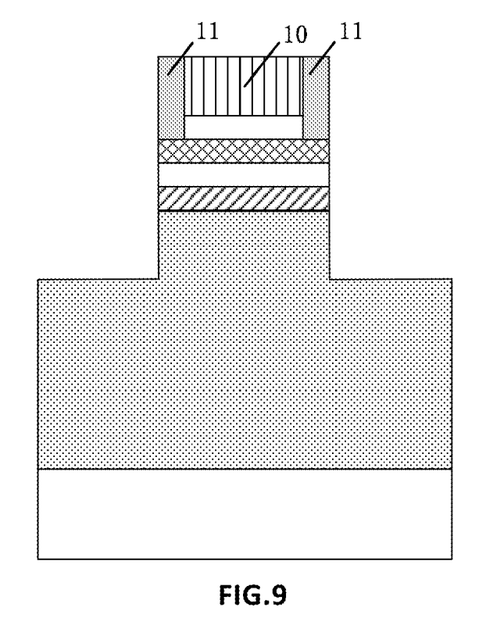

After forming the gate, spacer 11 can be formed on opposite sides of the gate, then an etching is performed using the gate and the spacers as a mask (in other words, taking the complete gate structure as a mask), until at least a portion of the fin-shaped buffer layer is removed by etching, as shown in FIG. 9 which is a cross-sectional view taken along the channel direction. It should be understood that various elements shown in the drawings are illustrative, and do not represent precise shapes of an actual and practical device anyway.

Figure 10:
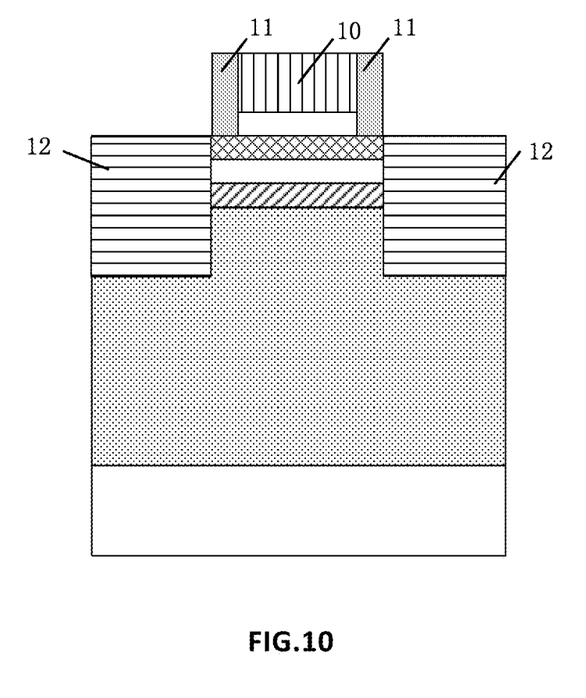

Next, as shown in FIG. 10, a semiconductor material is grown on the etched portion of the fin-shaped buffer layer to form a source region/drain region. FIG. 10 is a cross-sectional view taken along the channel direction.

Figure 11:
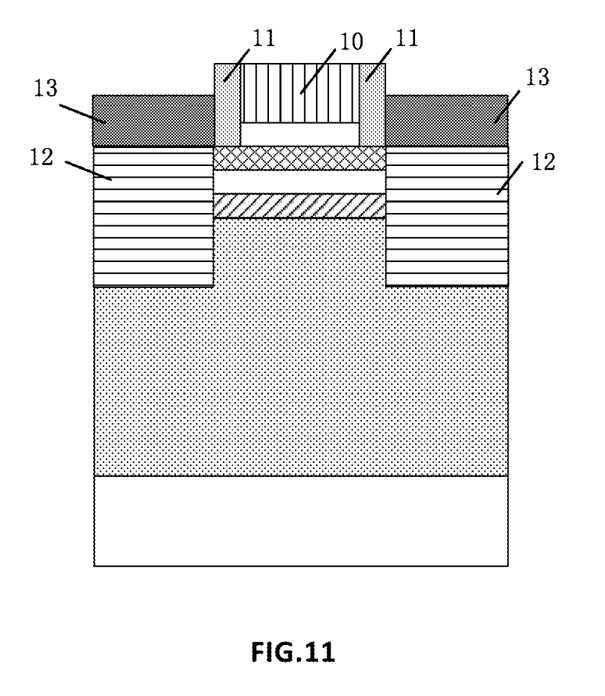

Finally, as shown in FIG. 11, a corresponding source electrode/drain electrode 13 can be formed in the source region/drain region. FIG. 11 is a cross-sectional view taken along the channel direction.

Note that FIG. 8-FIG. 11 are all cross-sectional views along the channel direction.

It should be understood that the inventive concept is not limited to the embodiments described above. For example, in another specific embodiment, the gate material can be polysilicon, the gate 10 can be a polysilicon gate or polysilicon pseudo gate. Those skilled in the art may readily understand that the polysilicon pseudo gate can be replaced by a metal gate in additional steps, for example, the polysilicon pseudo gate can be removed after the growth of the source region and the drain region, and then a metal gate can be formed.

Hence, a semiconductor device is further provided in the present disclosure, comprising: a substrate; a fin-shaped buffer layer on the surface of the substrate; a QW material layer on the surface of the fin-shaped buffer layer; and a barrier material layer on the QW material layer; wherein the QW material layer is suitable for forming an electron gas therein.

The above apparatus may further comprise an insulating portion on the surface of the substrate transversely adjacent to the fin-shaped buffer layer; and the QW material layer can be formed on the surface of the fin-shaped buffer layer that is not covered by the insulating portion.

The above apparatus may further comprise a cap layer on the barrier material layer; and a gate structure on at least a portion of the cap layer.

The semiconductor device and fabrication method thereof according to the inventive concept have been described with reference to the drawings. However, those details as known in the art are not described herein. One of ordinary skill in the art would fully and readily know how to implement the technical solutions disclosed herein in light of the above disclosures.

It should be understood by a person skilled in the art that the above embodiments can be modified or changed therein without departing from the scope and spirit of the inventive concept as claimed.

What is claimed is:

1. A semiconductor device comprising:
   a substrate;
   a fin-shaped buffer layer over the substrate;
   a Quantum Well (QW) material layer on the fin-shaped buffer layer, the QW material layer being suitable for forming an electron gas therein;
   a barrier material layer on the QW material layer;
   a cap layer on the barrier material layer; and
   a gate structure,
   wherein the QW material layer is suitable for forming an electron gas therein, and
   wherein the gate structure comprises a gate insulating layer on at least a portion of the cap layer, a gate on the gate insulating layer, and a spacer for the gate.

2. The semiconductor device according to claim 1, further comprising:
   a source region and a drain region each formed on an etched portion of the fin-shaped buffer layer.

3. The semiconductor device according to claim 1, wherein:
   the fin-shaped buffer layer has a thickness in range of about 1-2 µm;
   the QW material layer has a thickness in range of about 10-50 nm; and/or
   the barrier material layer has a thickness in range of about 1-5 nm.

4. The semiconductor device according to claim 1, wherein:
   the material of the fin-shaped buffer layer is AlN;
   the material of the QW material layer is GaN; and
   the material of the barrier material layer is AlN.

5. The semiconductor device according to claim 1, wherein:
   the QW material is one of the following materials: InGaN, AlGaN, Ge, Group III-Group V semiconductor materials, or Group II-Group VI semiconductor materials.

6. A semiconductor device comprising:
   a substrate;
   a fin-shaped buffer layer over the substrate;
   an insulating portion covering at least both side surfaces of a bottom portion of the fin-shaped buffer layer;
   a Quantum Well (QW) material layer on the fin-shaped buffer layer, the QW material layer being suitable for forming an electron gas therein; and
   a barrier material layer on the QW material layer,
   wherein the insulating portion does not contact a bottom surface of the fin-shaped buffer layer and QW material layer is formed on the surface of the fin-shaped buffer layer that is not covered by the insulating portion.

7. The semiconductor device according to claim 6, further comprising:
   a cap layer on the barrier material layer; and
   a gate structure,
   wherein the gate structure comprises a gate insulating layer on at least a portion of the cap layer, a gate on the gate insulating layer, and a spacer for the gate.

8. The semiconductor device according to claim 7, further comprising:
   a source region and a drain region each formed on an etched portion of the fin-shaped buffer layer.

9. The semiconductor device according to claim 7, wherein:
   the fin-shaped buffer layer has a thickness in range of about 1-2 µm;
   the QW material layer has a thickness in range of about 10-50 nm; and/or
   the barrier material layer has a thickness in range of about 1-5 nm.

10. The semiconductor device according to claim 7, wherein:
    the material of the fin-shaped buffer layer is AlN;
    the material of the QW material layer is GaN; and
    the material of the barrier material layer is AlN.

11. The semiconductor device according to claim 7, wherein:
    the QW material is one of the following materials: InGaN, AlGaN, Ge, Group III-Group V semiconductor materials, or Group II-Group VI semiconductor materials.

* * * * *